(12) United States Patent
Fazelpour et al.

(10) Patent No.: US 10,008,316 B2
(45) Date of Patent: Jun. 26, 2018

(54) INDUCTOR EMBEDDED IN A PACKAGE SUBSTRATE

(71) Applicant: QUALCOMM Incorporated, San Diego, CA (US)

(72) Inventors: Siamak Fazelpour, San Diego, CA (US); Charles David Paynter, Encinitas, CA (US); Ryan David Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 14/229,367

(22) Filed: Mar. 28, 2014

(65) Prior Publication Data
US 2015/0279545 A1 Oct. 1, 2015

(51) Int. Cl.
*H01F 5/00* (2006.01)
*H01F 27/28* (2006.01)
(Continued)

(52) U.S. Cl.
CPC ... *H01F 17/0013* (2013.01); *H01L 23/49822* (2013.01); *H01F 2017/002* (2013.01); *H01F 2017/0066* (2013.01); *H01L 23/49827* (2013.01); *H01L 23/645* (2013.01); *H01L 28/10* (2013.01); *H01L 2224/16225* (2013.01); *H01L 2924/14* (2013.01); *H01L 2924/15311* (2013.01); *H01L 2924/3011* (2013.01)

(58) Field of Classification Search
CPC ................................. H01F 5/00; H01F 27/28
USPC .................................................. 336/200, 232
See application file for complete search history.

(56) References Cited

U.S. PATENT DOCUMENTS 4,757,295 A * 7/1988 Pike ..................... H01F 19/08
336/175
6,177,732 B1 1/2001 Zu
(Continued)

FOREIGN PATENT DOCUMENTS

CN 1938794 A 3/2007
JP 06151185 A * 5/1994
(Continued)

OTHER PUBLICATIONS

International Search Report and Written Opinion—PCT/US2015/023129—ISA/EPO—dated Jul. 9, 2015.

*Primary Examiner* — Tsz Chan
(74) *Attorney, Agent, or Firm* — Loza & Loza, LLP/Qualcomm

(57) ABSTRACT

Some novel features pertain to a package substrate that includes a core layer, a first via, a first dielectric layer, and a first inductor. The core layer includes a first surface and a second surface. The first via is located in the core layer. The first dielectric layer is coupled to the first surface of the core layer. The first inductor is located in the first dielectric layer. The first inductor is coupled to the first via in the core layer. The first inductor is configured to generate a magnetic field that laterally traverses the package substrate. In some implementations, the package substrate further includes a first pad coupled to the first inductor, wherein the first pad is configured to couple to a solder ball. In some implementations, the package substrate includes a second via located in the core layer, and a second inductor located in the first dielectric layer.

27 Claims, 14 Drawing Sheets

(51) Int. Cl.
  *H01F 17/00* (2006.01)
  *H01L 23/498* (2006.01)
  *H01L 23/64* (2006.01)
  *H01L 49/02* (2006.01)

(56) References Cited

U.S. PATENT DOCUMENTS

| | | |
|---|---|---|
| 7,384,801 B2 | 6/2008 | Bhatt et al. |
| 7,474,539 B2 * | 1/2009 | Huang ................ H01L 23/645 |
| | | 361/782 |
| 8,222,714 B2 | 7/2012 | Shi et al. |
| 8,350,358 B2 | 1/2013 | Kim et al. |
| 8,384,507 B2 | 2/2013 | Li et al. |
| 2005/0152184 A1 | 7/2005 | Chiu |
| 2005/0212642 A1 | 9/2005 | Pleskach et al. |
| 2006/0180905 A1 * | 8/2006 | Zeng ................ H01L 23/49822 |
| | | 257/678 |
| 2006/0220773 A1 * | 10/2006 | Su ...................... H01F 17/0006 |
| | | 336/200 |
| 2007/0257761 A1 * | 11/2007 | Mano ................ H01F 17/0006 |
| | | 336/200 |
| 2008/0079139 A1 | 4/2008 | Ye et al. |
| 2008/0231402 A1 * | 9/2008 | Jow ..................... H01F 17/0013 |
| | | 336/83 |
| 2008/0266042 A1 * | 10/2008 | Yoshimura .......... H01F 27/2804 |
| | | 336/181 |
| 2008/0297299 A1 * | 12/2008 | Yun ..................... H01F 17/0013 |
| | | 336/200 |
| 2009/0085155 A1 | 4/2009 | Bailey et al. |
| 2010/0141369 A1 * | 6/2010 | Mori .................... H01F 17/0013 |
| | | 336/200 |
| 2010/0308471 A1 | 12/2010 | Korogi et al. |
| 2011/0317387 A1 | 12/2011 | Pan et al. |
| 2012/0112868 A1 * | 5/2012 | Wu ........................ H01F 5/003 |
| | | 336/200 |
| 2012/0212316 A1 * | 8/2012 | Cho .................... H01L 23/5225 |
| | | 336/84 M |

FOREIGN PATENT DOCUMENTS

| | | |
|---|---|---|
| JP | 2002100733 A * | 4/2002 |
| WO | 2011153162 A1 | 12/2011 |

* cited by examiner

INDUCTOR EMBEDDED IN A PACKAGE SUBSTRATE

BACKGROUND

Field

Various features relate to an inductor embedded in a package substrate.

Background

FIG. 1 illustrates a conventional integrated package 100 that includes a substrate 102, a set of interconnects 104, a first die 106, a second die 108, a first set of solder balls 116, a second set of solder balls 118, and a third set of solder balls 120. The set of interconnects 104 includes traces and vias, which are located inside the substrate 102. The first die 106 is coupled to the substrate 102 through the first set of solder balls 116. The second die 108 is coupled to the substrate 102 through the second set of solder balls 118. The third set of solder balls 120 is coupled to the substrate 102. The first die 106 and the second die 104 are coupled to the third set of solder balls 120 through the set of interconnects 104. Typically, the third set of solder balls 120 is coupled to a printed circuit board (PCB) (not shown).

Conventional integrated packages, such as the one described in FIG. 1, have certain limitations and downsides. For example, the set of interconnects 104 may have certain impedance values which do not match or closely match with the impedance values of the third set of solder balls 120. This mismatch in impedance values can cause signal loss or signal degradation, which affects the overall performance of the package substrate, and ultimately the performance of the integrated device that includes the package substrate. Similar results (e.g., mismatch in impedance values) may occur when using landing pads instead of solder balls.

The mismatch in impedance values is because of the size difference between the size of the set of interconnects 104 and the size of the third set of solder balls 120. Generally speaking, solder balls are substantially bigger than an interconnect (e.g., trace, via) in a package substrate. There is also a similar size difference between the size of the set of interconnects 104 and the size of landing pads.

Therefore, there is a need for a cost effective integrated package that has a low profile but also takes up a little real estate as possible. Ideally, such an integrated package will also provide higher density connections with the dies.

SUMMARY

Various features, apparatus and methods described herein provide an inductor embedded in a package substrate.

A first example provides a package substrate that includes a core layer, a first via, a first dielectric layer, and a first inductor. The core layer includes a first surface and a second surface. The first via is located in the core layer. The first dielectric layer is coupled to the first surface of the core layer. The first inductor is located in the first dielectric layer. The first inductor is coupled to the first via in the core layer. The first inductor is configured to generate a magnetic field that laterally traverses the package substrate.

According to an aspect, the package substrate includes a first pad coupled to the first inductor, where the first pad is configured to couple to a solder ball. In some implementations, the first inductor is configured to provide an impedance difference between the first pad and a signal interconnect of 2.5 ohms or less.

According to one aspect, the first inductor includes a first set of vias and a first set of interconnects.

According to an aspect, the package substrate includes a second via located in the core layer and a second inductor in the first dielectric layer, where the second inductor is coupled to the second via in the core layer. In some implementations, the first inductor is positioned in the first dielectric layer such that the magnetic field that is generated by the first inductor affects the impedance of a pad coupled to the second inductor. In some implementations, the first inductor is positioned in the first dielectric layer such that the magnetic field that is generated by the first inductor amplifies a magnetic field that is generated by the second inductor. In some implementations, the second inductor is configured to generate a magnetic field that laterally traverses the package substrate.

According to one aspect, the package substrate includes a second dielectric layer coupled to the second surface of the core layer, and a set of interconnects in the second dielectric layer, where the set of interconnects coupled to the via in the core layer.

According to an aspect, the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a core layer comprising a first surface and a second surface, a first via located in the core layer, a first dielectric layer coupled to the first surface of the core layer, and a first inductor means located in the first dielectric layer, the first inductor means coupled to the first via in the core layer, wherein the first inductor means is configured to generate a magnetic field that laterally traverses the package substrate.

According to an aspect, the apparatus includes a first pad coupled to the first inductor means, where the first pad is configured to couple to a solder ball. In some implementations, the first inductor means is configured to provide an impedance difference between the first pad and a signal interconnect of 2.5 ohms or less.

According to one aspect, the first inductor means includes a first set of vertical interconnect means, and a first set of lateral interconnects means.

According to an aspect, the apparatus includes a second via located in the core layer, and a second inductor means in the first dielectric layer, where the second inductor means coupled to the second via in the core layer. In some implementations, the first inductor means is positioned in the first dielectric layer such that the magnetic field that is generated by the first inductor means affects the impedance of a pad coupled to the second inductor means. In some implementations, the first inductor means is positioned in the first dielectric layer such that the magnetic field that is generated by the first inductor means amplifies a magnetic field that is generated by the second inductor means. In some implementations, the second inductor means is configured to generate a magnetic field that laterally traverses the package substrate.

According to one aspect, the apparatus includes a second dielectric layer coupled to the second surface of the core layer, and a set of interconnects in the second dielectric layer, where the set of interconnects coupled to the via in the core layer.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for fabricating a package substrate. The method forms a core layer comprising a first surface and a second surface. The method forms a first via in the core layer. The method further forms a first dielectric layer coupled to the first surface of the core layer. The method also forms a first inductor in the first dielectric layer such that the first inductor is coupled to the first via in the core layer. The first inductor is configured to generate a magnetic field that laterally traverses the package substrate.

According to an aspect, the method forms a first pad such that the first pad is coupled to the first inductor, where the first pad is configured to couple to a solder ball. In some implementations, the first inductor is configured to provide an impedance difference between the first pad and a signal interconnect of 2.5 ohms or less.

According to one aspect, forming the first inductor includes forming a first set of vias, and forming a first set of interconnects.

According to an aspect, the method forms a second via located in the core layer, and forms a second inductor in the first dielectric layer such that the second inductor is coupled to the second via in the core layer. In some implementations, the first inductor is positioned in the first dielectric layer such that the magnetic field that is generated by the first inductor affects the impedance of a pad coupled to the second inductor. In some implementations, the first inductor is positioned in the first dielectric layer such that the magnetic field that is generated by the first inductor amplifies a magnetic field that is generated by the second inductor. In some implementations, the second inductor is configured to generate a magnetic field that laterally traverses the package substrate.

According to one aspect, the method forms a second dielectric layer coupled to the second surface of the core layer, forms a set of interconnects in the second dielectric layer, where the set of interconnects coupled to the via in the core layer.

According to an aspect, the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a package substrate that includes a core layer, a first via (e.g., first pin), a first dielectric layer, and a first inductor. The core layer includes a first surface and a second surface. The first via is located in the core layer. The first dielectric layer is coupled to the first surface of the core layer. The first inductor is located in the first dielectric layer. The first inductor is coupled to the first via in the core layer. The first inductor is configured to generate a magnetic field that laterally traverses the package substrate. In some implementations, the package substrate further includes a first pad coupled to the first inductor, wherein the first pad is configured to couple to a solder ball. In some implementations, the first inductor includes a first set of vias, and a first set of interconnects. In some implementations, the package substrate includes a second via (e.g., second pin) located in the core layer, and a second inductor located in the first dielectric layer, wherein the second inductor coupled to the second via in the core layer. In some implementations, the first inductor is positioned in the first dielectric layer such that the magnetic field that is generated by the first inductor affects the impedance of a pad coupled to the second inductor.

Exemplary Package Substrate that Includes an Inductor

Figure 1:
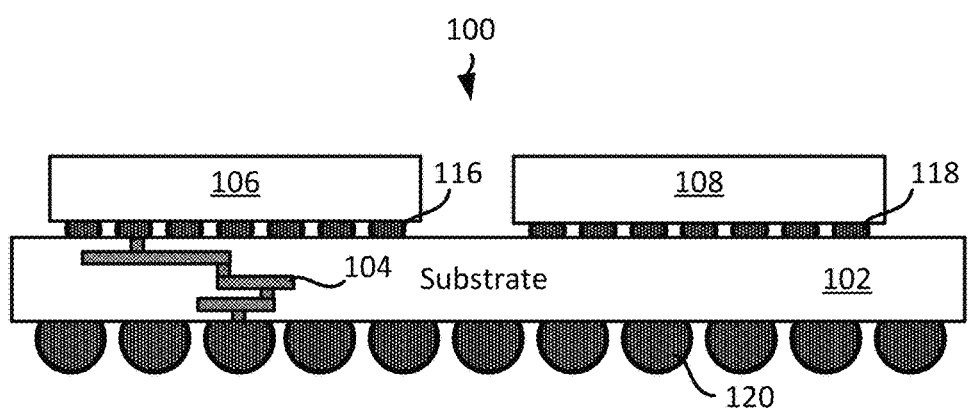
FIG. 1 illustrates a profile view of a conventional integrated device.
Figure 2:
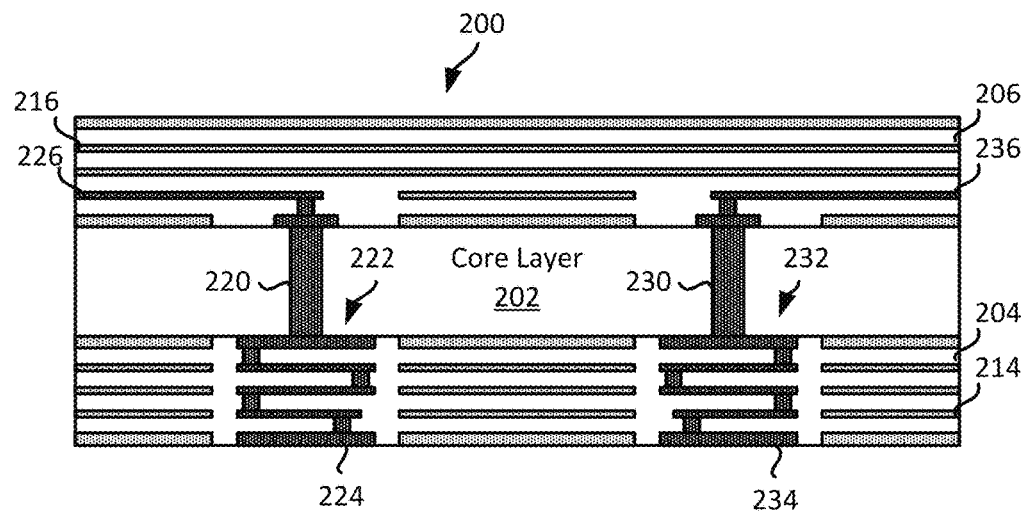
FIG. 2 illustrates an example of a package substrate that includes inductors.

FIG. 2 conceptually illustrates an example a package substrate that includes an inductor. Specifically, FIG. 2 illustrates a package substrate 200 that includes a core layer 202, a first dielectric layer 204, and a second dielectric layer 206. In some implementations, the first dielectric layer 204 may include several dielectric layers. Similarly, in some implementations, the second dielectric layer 206 may include several dielectric layers.

The core layer 202 includes a first via 220 and a second via 230. In some implementations, the first via 220 and/or the second via 230 may be a pin. The first dielectric layer 204 includes a first set of interconnects 214, a first inductor 222, a first pad 224, a second inductor 232, and a second pad 234. The second dielectric layer 206 includes a second set of interconnects 216, a third set of interconnects 226, and a fourth set of interconnects 236.

The first inductor 222 includes several interconnects (e.g., traces, vias, pads), which are configured to provide a set of windings for the first inductor 222. A first portion (e.g., top portion) of the first inductor 222 is coupled to a first portion (e.g., bottom portion) of the first via 220. A second portion (e.g., bottom portion) of the first inductor 222 is coupled to the first pad 224. In some implementations, the first pad 224 is configured to couple to a set of solder balls. In some implementations, the first inductor 222 is configured in such a way that the impedance of the first pad 224 matches or closely matches the impedance of the signal interconnect to which the first pad 224 will be coupled to. In some implementations, a signal interconnect may include one of at least a via (e.g., first via 220) in the core layer 202 and/or a set of interconnects (e.g., fourth set of interconnects 236) in the second dielectric layer 206. In some implementations, the signal interconnect may include the inductor 222 and/or the inductor 232. In some implementations, an interconnect may include a trace.

In some implementations, matching the impedance or reducing the difference between the impedance of a signal interconnect and the pad(s) provides better signal performance. For example, matching the impedance or reducing the impedance difference reduces signal loss and/or signal degradation between the pad and signal interconnect, thereby providing better signal performance for the package substrate.

A second portion (e.g., top portion) of the first via 220 is coupled to the third set of interconnects 226. The third set of interconnects 226 are located in the second dielectric layer 206. The third set of interconnects 226 may include traces and/or vias.

The second inductor 232 includes several interconnects (e.g., traces, vias, pads), which are configured to provide a set of windings for the second inductor 232. A first portion (e.g., top portion) of the second inductor 232 is coupled to a first portion (e.g., bottom portion) of the second via 230. A second portion (e.g., bottom portion) of the second inductor 232 is coupled to the second pad 234. In some implementations, the second pad 224 is configured to couple to a set of solder balls. In some implementations, the second inductor 232 is configured in such a way that the impedance of the second pad 234 matches or closely matches the impedance of the signal interconnect to which the second pad 234 will be coupled to.

A second portion (e.g., top portion) of the second via 230 is coupled to the fourth set of interconnects 236. The fourth set of interconnects 236 are located in the second dielectric layer 206. The fourth set of interconnects 236 may includes traces and/or vias.

Figure 3:
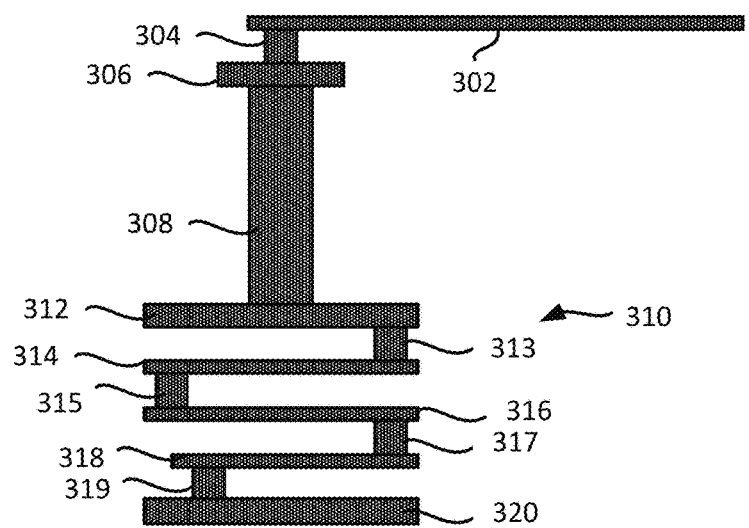
FIG. 3 illustrates an example of an inductor coupled to a via.

FIG. 3 illustrates a close up view of a set of interconnects in a package substrate, where some of the set of interconnects are configured to operate as an inductor. For purpose of clarity, the package substrate is not shown in FIG. 3.

FIG. 3 illustrates a first trace 302 coupled to a first via 304. The first via 304 is coupled to a pad 306. In some implementations, the first trace 302, the first via 304, and the first pad 306 are located in a first dielectric layer (e.g., dielectric layer 206) of a package substrate (e.g., package substrate 200).

The first pad 306 is coupled to a first portion (e.g., top portion) of the first via 308. In some implementations, the first via 308 is a pin. In some implementations, the first via 308 is located in a core layer (e.g., core layer 202) of a package substrate. A second portion (e.g., bottom portion) of the first via 308 is coupled to a first inductor 310. In some implementations, the first inductor 310 is located in a second dielectric layer (e.g., dielectric layer 204) of a package substrate.

The first inductor 310 includes a second pad 312, a second via 313, a second trace 314, a third via 315, a third trace 316, a fourth via 317, a fourth trace 318, and a fifth via 319. The second pad 312 is coupled to the second portion of the first via 308. The second pad 312 is also coupled to the second via 313. The second via 313 is coupled to the second trace 314. The second trace 314 is coupled to the third via 315. The third via 315 is coupled to the third trace 316. The third trace 316 is coupled to the fourth via 317. The fourth via 317 is coupled the fourth trace 318. The fourth trace 318 is coupled to the fifth via 319. The fifth via 319 is coupled to the third pad 320. In some implementations, the third pad 320 is configured to couple to a solder ball or another pad (e.g., landing pad from landing pad array).

In some implementations, the second pad 312, the second via 313, the second trace 314, the third via 315, the third trace 316, the fourth via 317, the fourth trace 318, and/or the fifth via 319 are configured to operate as a spiral winding for the first inductor 310. In some implementations, the third pad 320 is part of the first inductor 310. It should be noted that different implementations may have different numbers of traces and/or vias. Different configurations of the inductor will produce different magnetic fields along different directions. In some implementations, the strength and/or direction of the magnetic field generated by the inductor will affect the impedance of the pad (e.g., pad that is coupled to a solder ball) or the via (e.g., pin). In some implementations, the inductor is coupled to a signal interconnect. In some implementations, a signal interconnect may include one of at least a via (e.g., via 308), a pad (e.g., pad 306) and/or a trace (e.g., trace 302). In some implementations, the signal interconnect may include the inductor.

Figure 4:
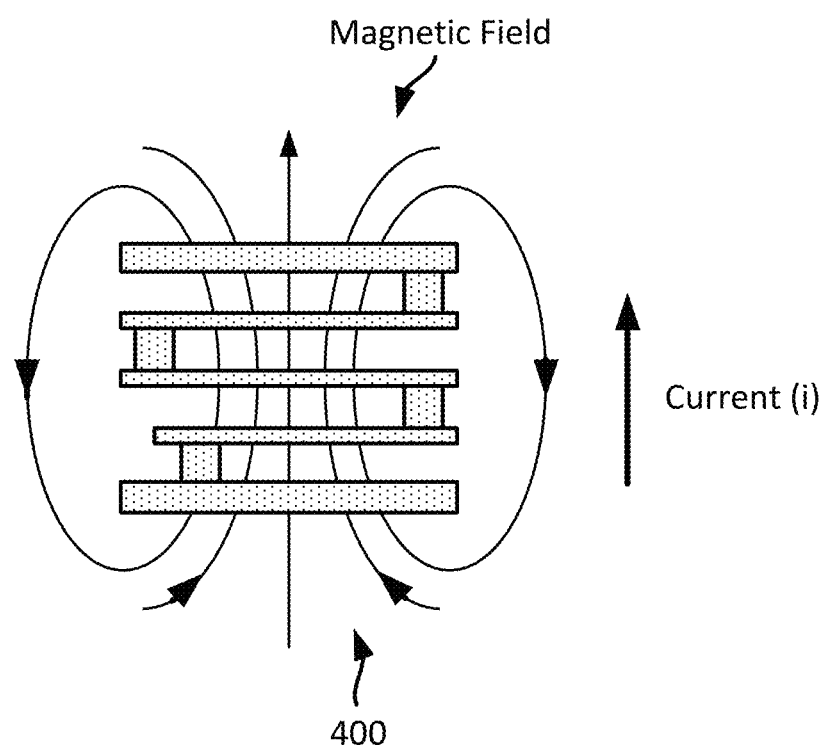
FIG. 4 illustrates an example of a magnetic field generated by an inductor.

FIG. 4 illustrates an example of a magnetic field that may be generated by an inductor in a package substrate. As shown in FIG. 4, an inductor 400 generates a vertical magnetic field. In some implementations, the inductor 400 is similar to the inductors 222 and 232 of FIG. 2, and/or the inductor 310 of FIG. 3. In some implementations, the vertical magnetic field helps improve the impedance difference (e.g., reduce the impedance difference between a pad and a signal interconnect). For example, in some implementations, the use of an inductor coupled to a via and a pad may reduce the impedance difference between a pad and a signal interconnect to 2.5 ohms or less. In some implementations, excess magnetic field resonates away excess electrical field created by a big pad, resulting in a pad with higher impedance which is closer to that of a signal interconnect.

Different configurations of an inductor will produce different magnetic fields. Other configurations of an inductor will be further described below in FIGS. 6-10.

Figure 5:
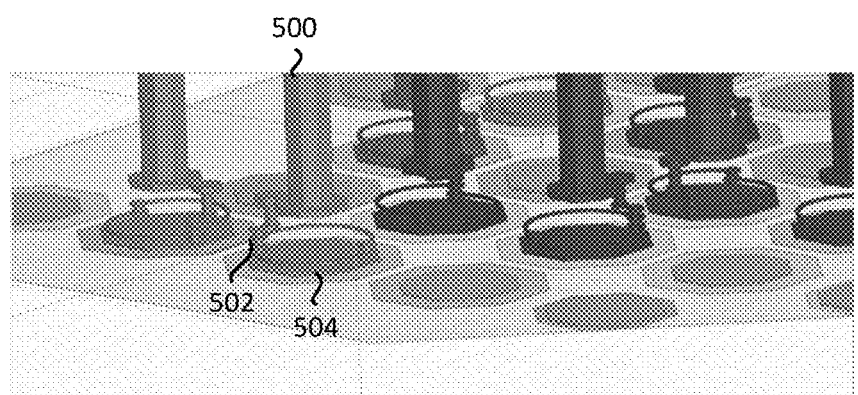
FIG. 5 illustrates a close up angled view of examples inductors coupled to vias and a pad.

FIG. 5 illustrates an angled view of vias coupled to inductors. For purpose of clarity, a package substrate is not shown, although the inductors shown in FIG. 5 may be implemented in a package substrate. As shown in FIG. 5, a first via 500 is coupled to a first inductor 502. The first inductor 502 includes several interconnects (e.g., traces, vias, pads) which are configured to operate as a first spiral winding for the first inductor 502. The first inductor 502 is also coupled to a first pad 504. The first pad 504 may be configured to couple to a solder ball or a landing pad from a landing pad array.

Exemplary Package Substrate that Includes an Inductor Generating Lateral Magnetic Field Different configurations of an inductor will produce different magnetic fields. In some implementations, an inductor may be configured to produce a lateral magnetic field (e.g., magnetic field that laterally traverses a package substrate) in a package substrate, which may provide several technical advantages.

Figure 6:
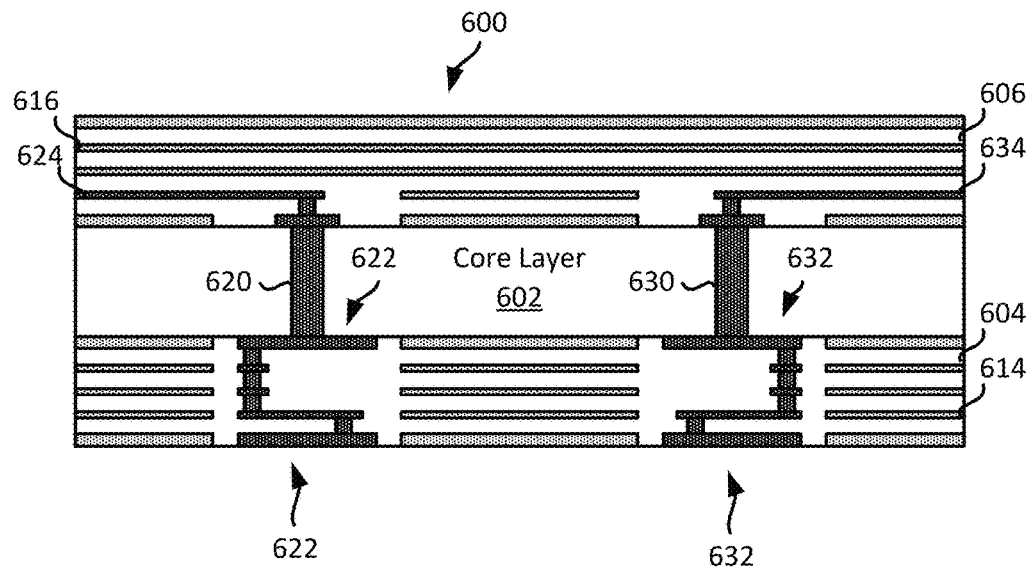
FIG. 6 illustrates an example of a package substrate that includes inductors.

FIG. 6 conceptually illustrates an example of a package substrate that includes an inductor that can produce a lateral magnetic field. Specifically, FIG. 6 illustrates a package substrate 600 that includes a core layer 602, a first dielectric layer 604, and a second dielectric layer 606. In some implementations, the first dielectric layer 604 may include several dielectric layers. Similarly, in some implementations, the second dielectric layer 606 may include several dielectric layers.

The core layer 602 includes a first via 620 and a second via 630. In some implementations, the first via 620 and/or the second via 630 may be a pin. The first dielectric layer 604 includes a first set of interconnects 614, a first inductor 622, a first pad 624, a second inductor 632, and a second pad 634. The second dielectric layer 606 includes a second set of interconnects 616, a third set of interconnects 626, and a fourth set of interconnects 636.

The first inductor 622 includes several interconnects (e.g., traces, vias, pads), which are configured to provide a set of windings for the first inductor 622. A first portion (e.g., top portion) of the first inductor 622 is coupled to a first portion (e.g., bottom portion) of the first via 620. A second portion (e.g., bottom portion) of the first inductor 622 is coupled to the first pad 624. In some implementations, the first pad 624 is configured to couple to a set of solder balls. In some implementations, the first inductor 622 is configured in such a way that the impedance of the first pad 624 matches or closely matches the impedance of the signal interconnect to which the first pad 624 will be coupled to. In some implementations, a signal interconnect may include one of at least a via (e.g., first via 620) in the core layer 602 and/or a set of interconnects (e.g., fourth set of interconnects 636) in the second dielectric layer 606. In some implementations, the signal interconnect may include the inductor 622 and/or the inductor 632. In some implementations, an interconnect may include a trace. The first inductor 622 may be configured to provide a magnetic field that laterally traverses the package substrate 600. A technical advantage and/or benefit of a magnetic field that laterally traverses a package substrate will be further described in FIGS. 8-9.

In some implementations, matching the impedance or reducing the difference between the impedance of the signal interconnect and the pads provides better signal performance. For example, matching the impedance or reducing the impedance difference reduces signal loss and/or signal degradation between the pad and the signal interconnect, thereby providing better signal performance for the package substrate.

A second portion (e.g., top portion) of the first via 620 is coupled to the third set of interconnects 626. The third set of interconnects 626 are located in the second dielectric layer 606. The third set of interconnects 626 may includes traces and/or vias.

The second inductor 632 includes several interconnects (e.g., traces, vias, pads), which are configured to provide a set of windings for the second inductor 632. A first portion (e.g., top portion) of the second inductor 632 is coupled to a first portion (e.g., bottom portion) of the second via 630. A second portion (e.g., bottom portion) of the second inductor 632 is coupled to the second pad 634. In some implementations, the second pad 624 is configured to couple to a set of solder balls.

In some implementations, the second inductor 632 is configured in such a way that the impedance of the second pad 634 matches or closely matches the impedance of the signal interconnect to which the second pad 634 will be coupled to. The second inductor 632 may be configured to provide a magnetic field that laterally traverses the package substrate 600. As mentioned above, a technical advantage and/or benefit of a magnetic field that laterally traverses a package substrate will be further described in FIGS. 8-9.

A second portion (e.g., top portion) of the second via 630 is coupled to the fourth set of interconnects 636. The fourth set of interconnects 636 are located in the second dielectric layer 606. The fourth set of interconnects 636 may includes traces and/or vias.

Figure 7:
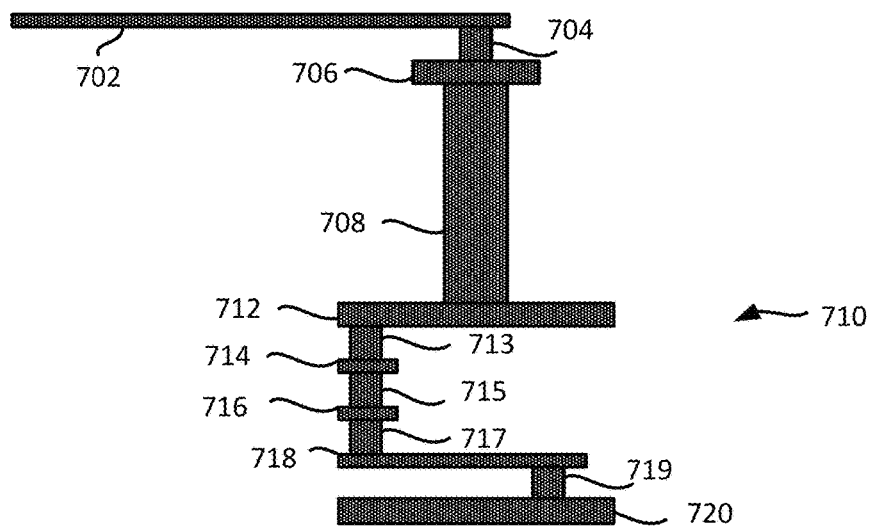
FIG. 7 illustrates an example of an inductor coupled to a via.

FIG. 7 illustrates a close up view of a set of interconnects in a package substrate, where some of the set of interconnects are configured to operate as an inductor. For purpose of clarity, the package substrate is not shown in FIG. 7.

FIG. 7 illustrates a first trace 702 coupled to a first via 704. The first via 704 is coupled to a pad 706. In some implementations, the first trace 702, the first via 704, and the first pad 706 are located in a first dielectric layer (e.g., dielectric layer 606) of a package substrate (e.g., package substrate 600).

The first pad 706 is coupled to a first portion (e.g., top portion) of the first via 708. In some implementations, the first via 708 is a first pin. In some implementations, the first via 708 is located in a core layer (e.g., core layer 602) of a package substrate. A second portion (e.g., bottom portion) of the first via 708 is coupled to a first inductor 710. In some implementations, the first inductor 710 is located in a second dielectric layer (e.g., dielectric layer 604) of a package substrate.

The first inductor 710 includes a second pad 712, a second via 713, a second trace 714, a third via 715, a third trace 716, a fourth via 717, a fourth trace 718, and a fifth via 719. The second pad 712 is coupled to the second portion of the first via 708. The second pad 712 is also coupled to the second via 713. The second via 713 is coupled to the second trace 714. The second trace 714 is coupled to the third via 715. The third via 715 is coupled to the third trace 716. The third trace 716 is coupled to the fourth via 717. The fourth via 717 is coupled the fourth trace 718. The fourth trace 718 is coupled to the fifth via 719. The fifth via 719 is coupled to the third pad 720. In some implementations, the third pad 720 is configured to couple to a solder ball or another pad (e.g., landing pad from landing pad array).

In some implementations, the second pad 712, the second via 713, the second trace 714, the third via 715, the third trace 716, the fourth via 717, the fourth trace 718, and/or the fifth via 719 are configured to operate as a spiral winding for the first inductor 710. In some implementations, the third pad 720 is part of the first inductor 710. It should be noted that different implementations may have different numbers of traces and/or vias. Different configurations of the inductor will produce different magnetic fields along different directions. In some implementations, the strength and/or direction of the magnetic field generated by the inductor will affect the impedance of the pad (e.g., pad that is coupled to a solder ball) or the via (e.g., pin). In some implementations, the inductor is coupled to a signal interconnect. In some implementations, a signal interconnect may include one of at least a via (e.g., via 708), a pad (e.g., pad 706) and/or a trace (e.g., trace 702). In some implementations, the signal interconnect includes the inductor.

Figure 8:
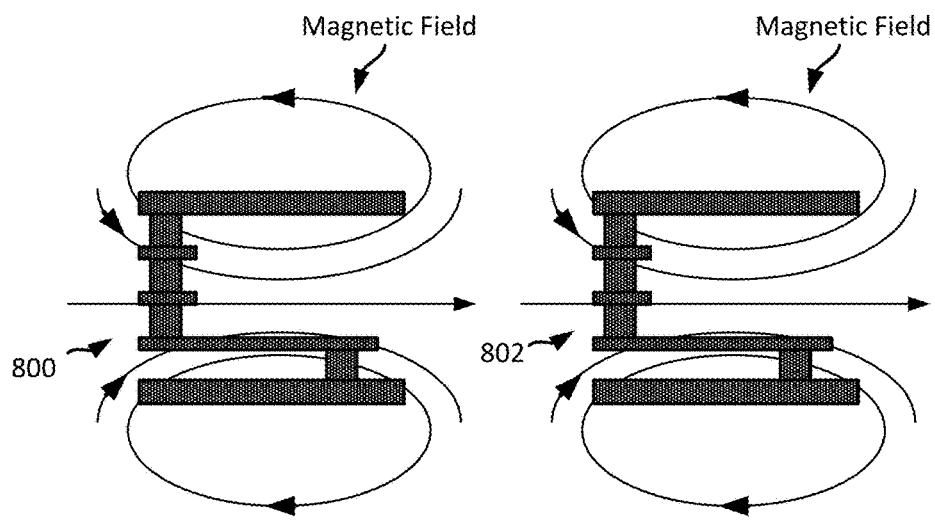
FIG. 8 illustrates an example of magnetic fields generated by inductors.

FIG. 8 illustrates an example of magnetic fields that may be generated by inductors in a package substrate. As shown in FIG. 8, a first inductor 800 generates a lateral magnetic field that laterally traverses a package substrate, and a second inductor 802 generates a magnetic field that also laterally traverses the package substrate. In some implementations, the inductors 800 and 802 are similar to the inductors 622 and 632 of FIG. 6, and/or the inductor 710 of FIG. 7. In some implementations, the lateral magnetic field helps improve the impedance difference (e.g., reduce the impedance difference between a pad and a signal interconnect). For example, in some implementations, the use of an inductor coupled to a via and a pad may reduce the impedance difference between a pad and a signal interconnect to 2.5 ohms or less.

FIG. 8 illustrates that the first inductor 800 is positioned such that the magnetic field generated by the first inductor 800 is directed towards the second inductor 802. That is, the first magnetic field of the first inductor 800 is aligned with the second magnetic of the second inductor 802. In some implementations, the magnetic field of the second inductor 802 may be amplified by the presence of the magnetic field of the first inductor 800. In some implementations, the amplification of the magnetic field due to two neighboring inductors may allow for improve impedance matching of the pads to the signal interconnect, without having to fabricate an unnecessary large inductor. Thus, with magnetic amplification due to two or more aligned inductors being near each other, two or more small inductors may produce a magnetic field that is equivalent to a bigger inductor, which may help with impedance matching of the pads and signal interconnect. In some implementations, excess magnetic field resonates away excess electrical field created by a big pad, resulting in a pad with higher impedance which is closer to that of a signal interconnect. In some implementations, orienting the inductor vertically, (e.g., like a solenoid), creates a lateral magnetic field, which may enhance the coupling (e.g., magnetic coupling) of positive and negative poles of different pairs of inductors. For example, a positive pole of a first inductor may have enhanced coupling to a negative pole of a second inductor. In some implementations, orientating one or more inductors in similar or different directions may result different pairs of inductors (e.g., adjacent inductors) to not have magnetic coupling with each other (e.g., achieve isolation of one inductor from another). For example, a first inductor may be oriented in a particular direction so as to have little or no effect (e.g., no magnetic coupling) on a second inductor.

Figure 9:
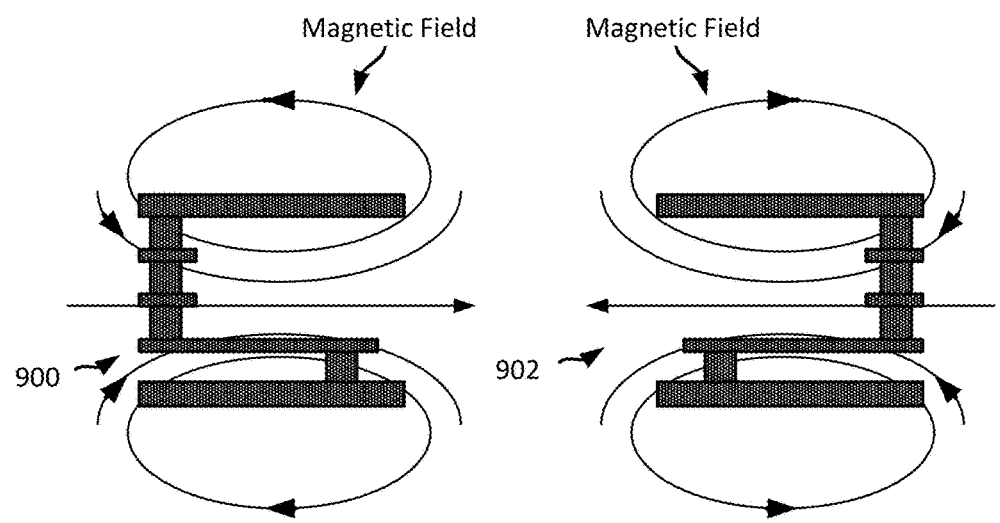
FIG. 9 illustrates an example of magnetic fields generated by inductors.

FIG. 9 illustrates an example of opposite magnetic fields that may be generated by inductors in a package substrate. As shown in FIG. 9, a first inductor 900 generates a lateral magnetic field that laterally traverses a package substrate, and a second inductor 902 generates a magnetic field that also laterally traverses the package substrate. In some implementations, the inductors 900 and 902 are similar to the inductors 622 and 632 of FIG. 6, and/or the inductor 710 of FIG. 7. In some implementations, the lateral magnetic field helps improve the impedance difference (e.g., reduce the impedance difference between a pad and a signal interconnect).

FIG. 9 illustrates that the first inductor 800 is positioned such that the direction of the magnetic field generated by the first inductor 800 is perpendicular to the direction of the magnetic field of the second inductor 902. In some implementations, the magnetic field of the second inductor 802 may be unaffected (e.g., because of orthogonality between them) by the presence of the magnetic field of the first inductor 800, and vice versa.

Figure 10:
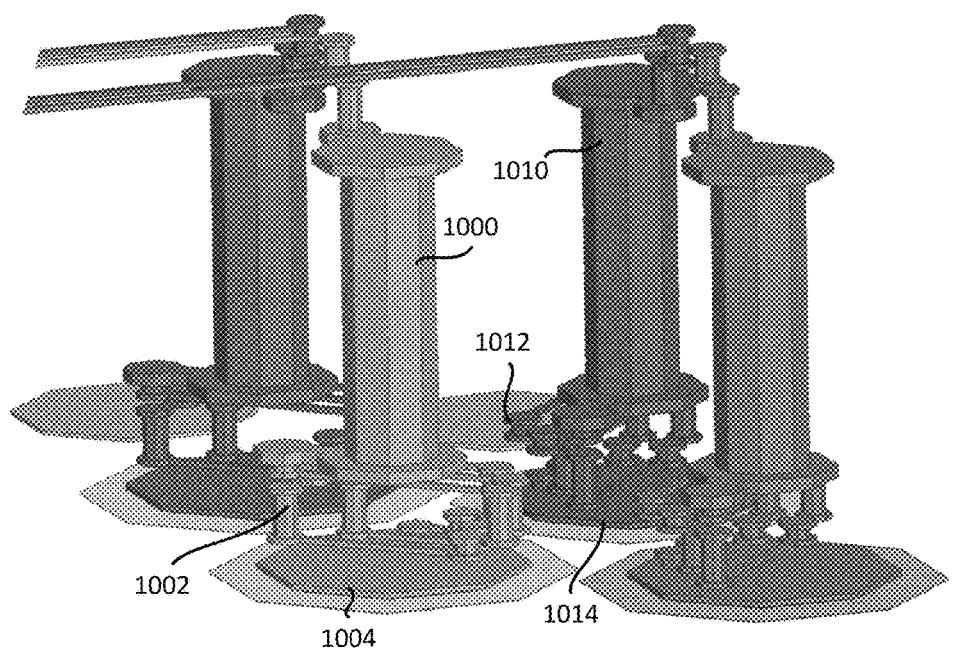
FIG. 10 illustrates an angled view of examples inductors coupled to vias and a pad.

FIG. 10 illustrates an angled view of vias coupled to inductors configured to provide lateral magnetic fields. For purpose of clarity, a package substrate is not shown, although the inductors shown in FIG. 10 may be implemented in a package substrate. As shown in FIG. 10, a first via 1000 is coupled to a first inductor 1002. The first inductor 1002 includes several interconnects (e.g., traces, vias, pads) which are configured to operate as a first spiral winding for the first inductor 1002. The first inductor 1002 is configured to generate a magnetic field that laterally traverses a substrate. The first inductor 1002 is also coupled to a first pad 1004. The first pad 1004 may be configured to couple to a solder ball or a landing pad from a landing pad array.

As shown in FIG. 10, the first inductor 1002 is positioned such that the magnetic field is directed towards a second inductor 1012. The second inductor 1012 is coupled to a second via 1010. The second inductor 1012 includes several interconnects (e.g., traces, vias, pads) which are configured to operate as a second spiral winding for the second inductor 1012. In some implementations, the second inductor 1012 is configured to generate a magnetic field that laterally traverses a substrate. The second inductor 1012 is also coupled to a second pad 1014. The second pad 1014 may be configured to couple to a solder ball or a landing pad from a landing pad array.

Exemplary Sequence for Providing a Package Substrate that Includes an Inductor

In some implementations, providing a package substrate that includes an inductor includes several processes. FIGS. 11A-11D illustrate an exemplary sequence for providing a package substrate. In some implementations, the sequence of FIGS. 11A-11D may be used to provide/manufacture the package substrate of FIGS. 2 and/or 6, and/or other package substrate described in the present disclose.

It should be noted that the sequence of FIGS. 11A-11D may combine one or more stages in order to simplify and/or clarify the sequence for providing a package substrate that includes an inductor.

Figure 11A:
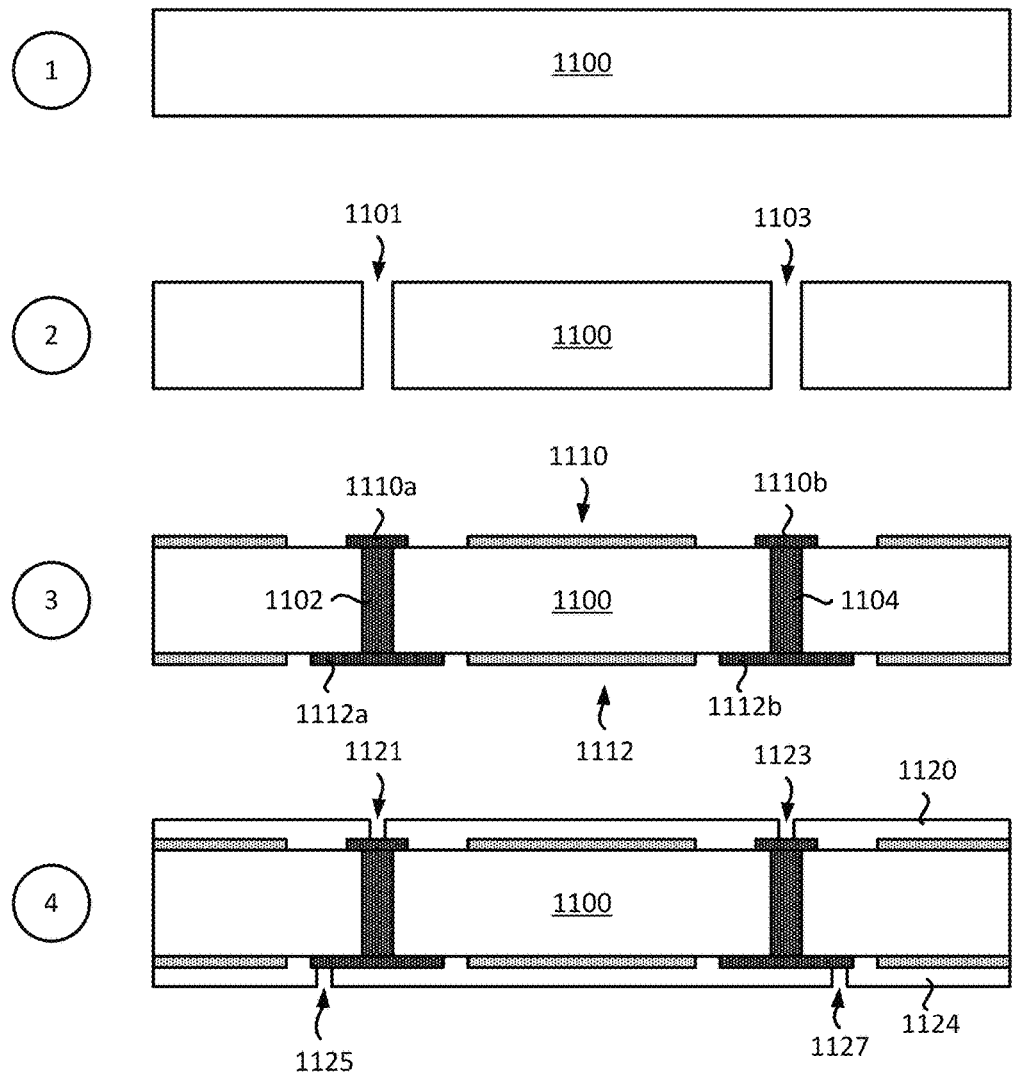
FIG. 11A illustrates part of an exemplary sequence for providing/fabricating a package substrate that includes an inductor.

As shown in stage 1 of FIG. 11A, a core layer 1100 is provided. In some implementations, providing the core layer 1100 may include receiving a core layer from a supplier or fabricating a core layer. Different implementations may use different materials for the core layer.

At stage 2, a first cavity 1101 and a second cavity 1103 are formed in the core layer 1100. Different implementations may use different processes for forming the cavities. In some implementations, a laser process and/or chemical process (e.g., photo etching) may be use to remove part of the core layer 1100 to form the cavities.

At stage 3, a first via 1102 and a second via 1104 are provided (e.g., formed) in the core layer 1100. Specifically a metal layer is provided in the first cavity 1101 to form the first via 1102, and a metal layer is provided in the second cavity 1103 to form the second via 1104. Different implementations may provide the metal layer differently. In some implementations, a plating process is used to provide the metal layer in the cavities. In some implementations, the first via 1102 and/or the second via 1104 is a pin.

At stage 3, a first metal layer 1110 is provided on a first surface (e.g., top surface) of the core layer 1100. The first metal layer 1110 includes a first pad 1110a and a second pad 1110b. The first pad 1110a is coupled to a first portion (e.g., top portion) of the first via 1102. The second pad 1110b is coupled to a first portion (e.g., top portion) of the second via 1104.

In addition, at stage 3, a second metal layer 1112 is provided on a second surface (e.g., bottom surface) of the core layer 1100. The second metal layer 1112 includes a third pad 1112a and a fourth pad 1112b. The third pad 1112a is coupled to a second portion (e.g., bottom portion) of the first via 1102. The fourth pad 1112b is coupled to a second portion (e.g., bottom portion) of the second via 1102. In some implementations, a plating process is used to provide the first metal layer 1110 and the second metal layer 1112.

At stage 4, a first dielectric layer 1120 is provided on the first surface (e.g., top surface) of the core layer 1100. A cavity 1121 and a cavity 1123 are also provided (e.g., formed) in the first dielectric layer 1120. In addition, at stage 4, a second dielectric layer 1124 is provided on the second surface (e.g., bottom surface) of the core layer 1100. A cavity 1125 and a cavity 1127 are also provided (e.g., formed) in the second dielectric layer 1122.

At stage 3, a first via 1102 and a second via 1104 are provided (e.g., formed) in the core layer 1100. Specifically a metal layer is provided in the first cavity 1101 to form the first via 1102, and a metal layer is provided in the second cavity 1103 to form the second via 1104. Different implementations may provide the metal layer differently. In some implementations, a plating process is used to provide the metal layer in the cavities.

Figure 11B:
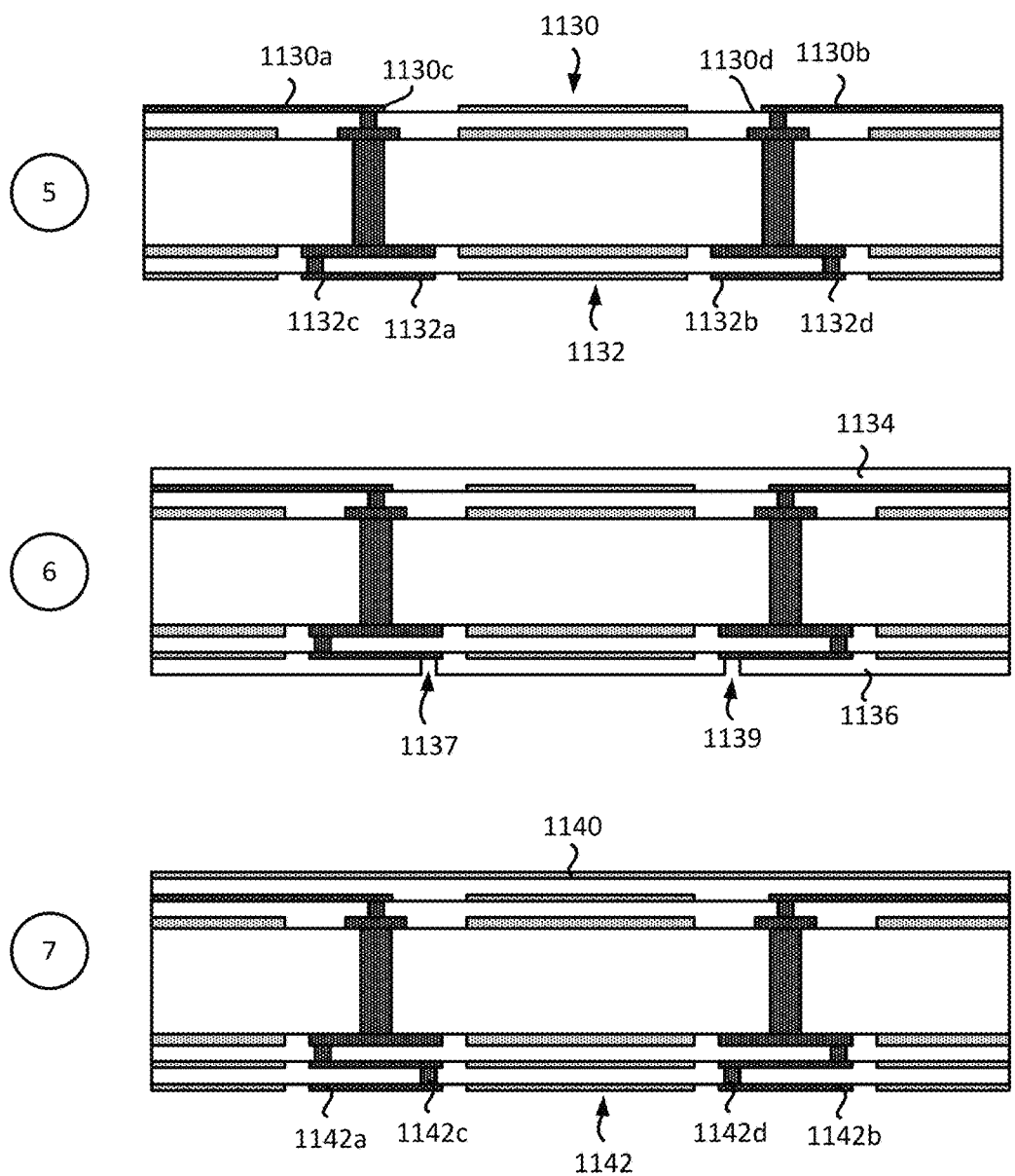
FIG. 11B illustrates part of an exemplary sequence for providing/fabricating a package substrate that includes an inductor.

At stage 5, as shown in FIG. 11B, a first metal layer 1130 is provided on the first dielectric layer 1120. The first metal layer 1130 includes a first trace 1130a, a second trace 1130b, a first via 1130c, and a second via 1130d. The first via 1130c is formed in the cavity 1121, and the second via 1130d is formed in the cavity 1123. In addition, at stage 5, a second metal layer 1132 is provided on the second dielectric layer 1122. The second metal layer 1132 includes a first trace 1132a, a second trace 1132b, a first via 1132c, and a second via 1132d. The first via 1132s is formed in the cavity 1125, and the second via 1132d is formed in the cavity 1127. In some implementations, a plating process is used to provide the first metal layer 1130 and the second metal layer 1132.

At stage 6, a dielectric layer 1134 is provided on the first dielectric layer 1120 and the first metal layer 1110. In addition, at stage 4, a dielectric layer 1136 is provided on the second dielectric layer 1122 and the second metal layer 1112. A cavity 1137 and a cavity 1139 are also provided (e.g., formed) in the dielectric layer 1136.

At stage 7, a first metal layer 1140 is provided on the dielectric layer 1134. In addition, at stage 7 a second metal layer 1142 is provided on the dielectric layer 1136. The second metal layer 1142 includes a first trace 1142a, a second trace 1142b, a first via 1142c, and a second via 1142d. The first via 1142s is formed in the cavity 1137, and the second via 1142d is formed in the cavity 1139. In some implementations, a plating process is used to provide the first metal layer 1140 and the second metal layer 1142.

Figure 11C:
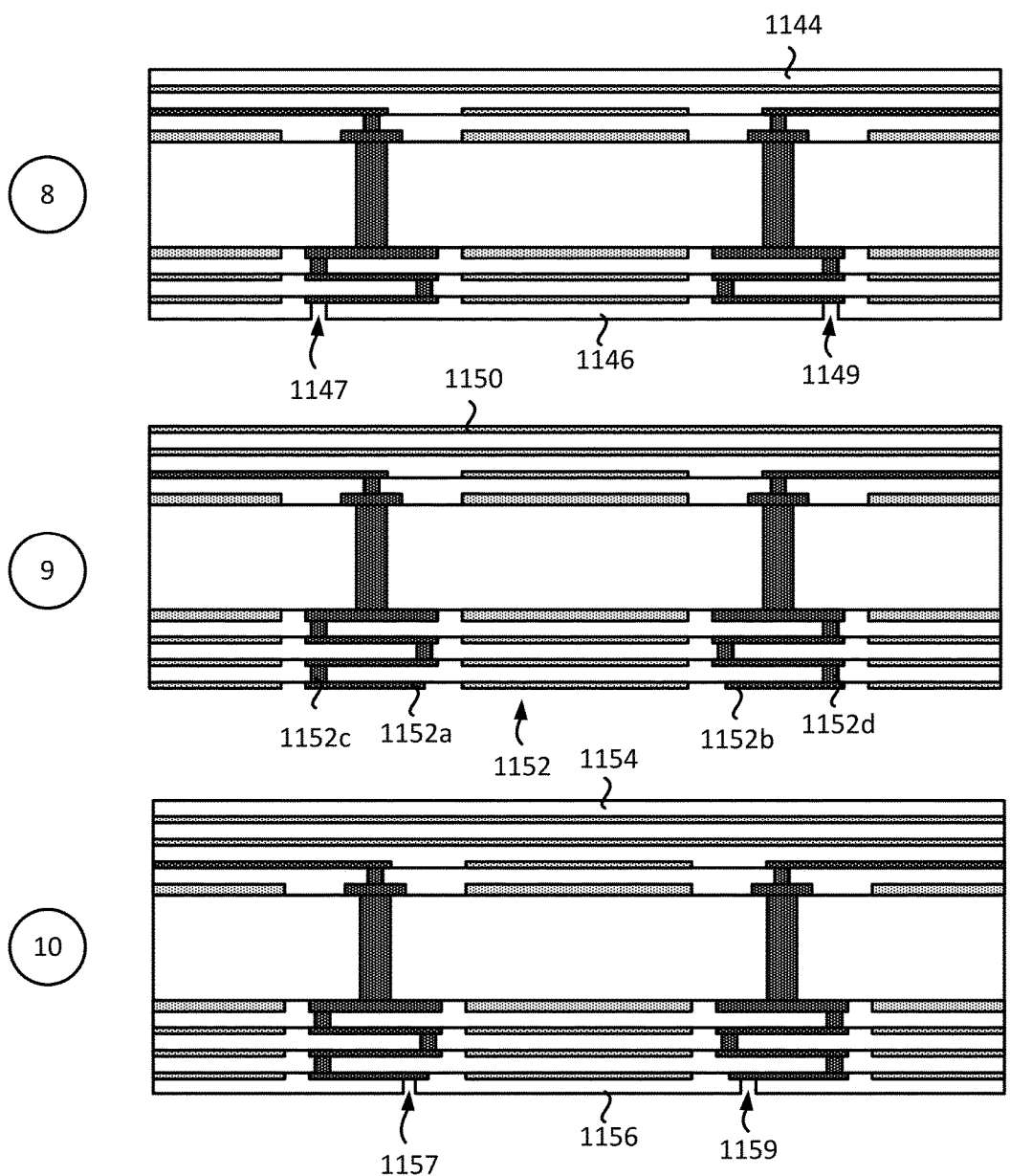
FIG. 11C illustrates part of an exemplary sequence for providing/fabricating a package substrate that includes an inductor.

At stage 8, as shown in FIG. 11C, a dielectric layer 1144 is provided on the dielectric layer 1134 and the first metal layer 1140. In addition, at stage 10, a dielectric layer 1146 is provided on the dielectric layer 1136 and the second metal layer 1142. A cavity 1147 and a cavity 1149 are also provided (e.g., formed) in the dielectric layer 1136.

At stage 9, a first metal layer 1150 is provided on the dielectric layer 1144. In addition, at stage 9 a second metal layer 1152 is provided on the dielectric layer 1146. The second metal layer 1152 includes a first trace 1152a, a second trace 1152b, a first via 1152c, and a second via 1152d. The first via 1152s is formed in the cavity 1147, and the second via 1152d is formed in the cavity 1149. In some implementations, a plating process is used to provide the first metal layer 1150 and the second metal layer 1152.

At stage 10, a dielectric layer 1154 is provided on the dielectric layer 1144 and the first metal layer 1150. In addition, at stage 10, a dielectric layer 1156 is provided on the dielectric layer 1146 and the second metal layer 1152. A cavity 1157 and a cavity 1159 are also provided (e.g., formed) in the dielectric layer 1136.

Figure 11D:
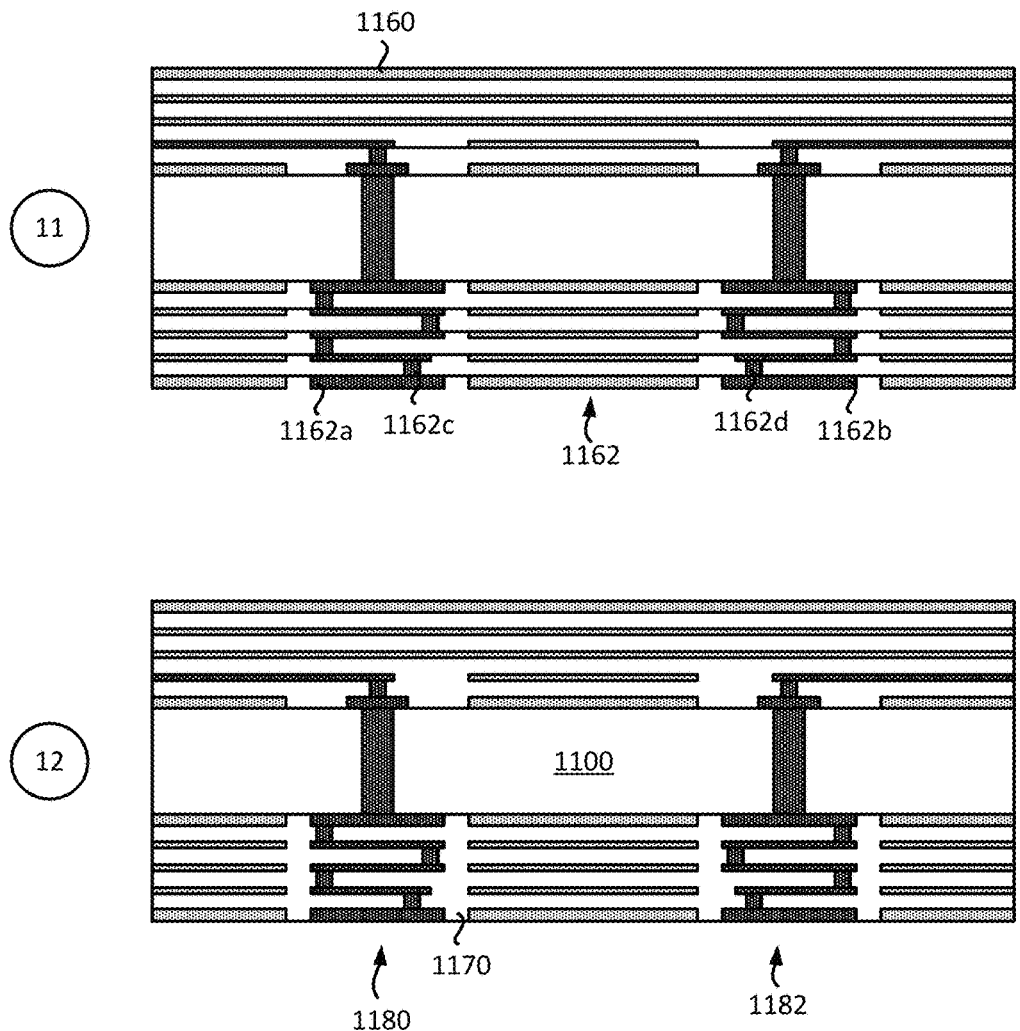
FIG. 11D illustrates part of an exemplary sequence for providing/fabricating a package substrate that includes an inductor.

At stage 11, as shown in FIG. 11D, a first metal layer 1160 is provided on the dielectric layer 1154. In addition, at stage 11 a second metal layer 1162 is provided on the dielectric layer 1156. The second metal layer 1162 includes a first pad 1162a, a second pad 1162b, a first via 1162c, and a second via 1162d. The first via 1162c is formed in the cavity 1157, and the second via 1162d is formed in the cavity 1159. In some implementations, a plating process is used to provide the first metal layer 1160 and the second metal layer 1162.

At stage 10, a dielectric layer 1170 is provided on the dielectric layer 1156 and the second metal layer 1162. Stage 10 illustrates a first inductor 1180 in the dielectric layers of the package substrate. Stage 10 also illustrates a second inductor 1182 in the dielectric layers of the package substrate. In some implementations, the first inductor 1180 and the second inductor 1182 are the inductors 222 and 232 of FIG. 2, inductor 310 of FIG. 3, inductors 622 and 632 of FIG. 6, and/or inductor 710 of FIG. 7.

Exemplary Method for Providing a Package Substrate that Includes an Inductor

Figure 12:
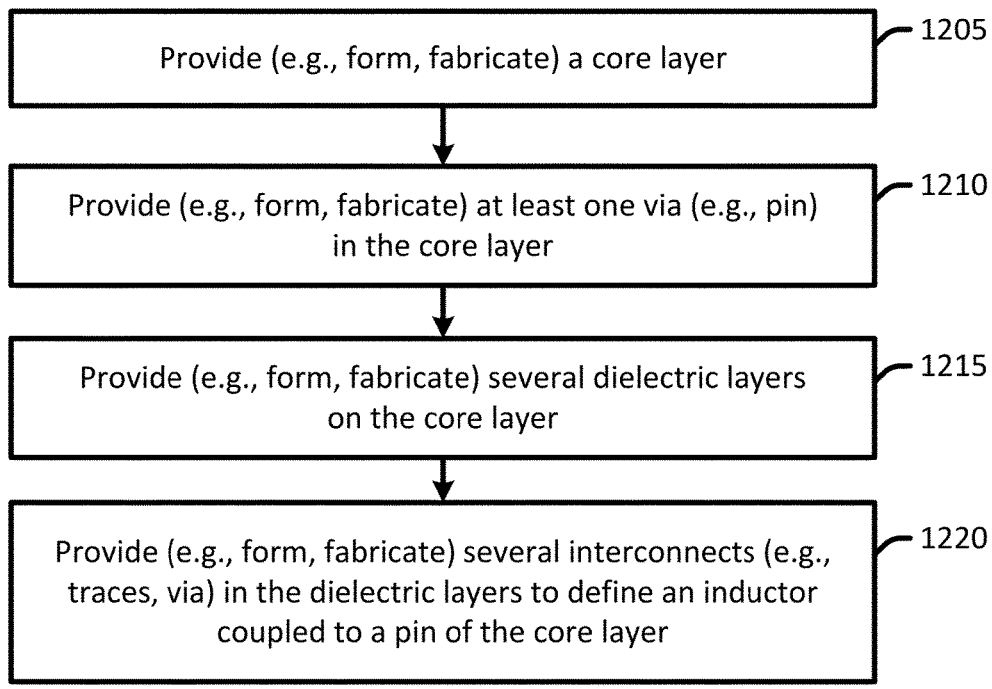
FIG. 12 illustrates part of an exemplary sequence for providing/fabricating a package substrate that includes an inductor.

In some implementations, providing a package substrate that includes an inductor includes several processes. FIG. 12 illustrates an exemplary method for providing a package substrate. In some implementations, the method of FIG. 12 may be used to provide/manufacture the package substrate of FIGS. 2 and/or 6, and/or other package substrate described in the present disclose.

It should be noted that the sequence of FIG. 12 may combine one or more stages in order to simplify and/or clarify the sequence for providing a package substrate that includes an inductor.

The method provides (at 1205) a core layer. In some implementations, providing the core layer 1100 may include receiving a core layer from a supplier or fabricating (e.g., forming) a core layer. Different implementations may use different materials for the core layer. Stage 1 of FIG. 11A illustrates an example of providing a core layer The method provides (at 1210) at least one via in the core layer. In some implementations, providing (e.g., forming) at least one via includes forming a cavity in the core layer and filling the cavity with a metal layer to define a via. In some implementations, a plating process is used to provide the via in the core layer. Stages 2 and 3 of FIG. 11A illustrates an example of providing at least one via in the core layer. As shown t stage 2, a first cavity 1101 and a second cavity 1103 are formed in the core layer 1100. Different implementations may use different processes for forming the cavities. In some implementations, a laser process and/or chemical process (e.g., photo etching) may be use to remove part of the core layer 1100 to form the cavities.

At stage 3, a first via 1102 and a second via 1104 are provided (e.g., formed) in the core layer 1100. Specifically a metal layer is provided (e.g., formed) in the first cavity 1101 to form the first via 1102, and a metal layer is provided in the second cavity 1103 to form the second via 1104. Different implementations may provide the metal layer differently. In some implementations, a plating process is used to provide the metal layer in the cavities. As shown at stage 4 of FIG. 11A, a first dielectric layer 1120 is provided on the first surface (e.g., top surface) of the core layer 1100. A cavity 1121 and a cavity 1123 are also provided (e.g., formed) in the first dielectric layer 1120. In addition, at stage 4, a second dielectric layer 1124 is provided on the second surface (e.g., bottom surface) of the core layer 1100. A cavity 1125 and a cavity 1127 are also provided (e.g., formed) in the second dielectric layer 1122.

The method also provides (at 1220) several interconnects in the dielectric layers to define an inductor that is coupled to a via in the core layer. In some implementations, providing (e.g., forming) one or more interconnects includes using a plating process to form metal layers in the dielectric layers. In some implementations, the interconnects that define the inductor may include traces, vias and/or pads. Stages 3-12 illustrate examples of providing interconnects in the dielectric layers to define an inductor.

Exemplary Package Substrate that Includes an Inductor

Figure 13:
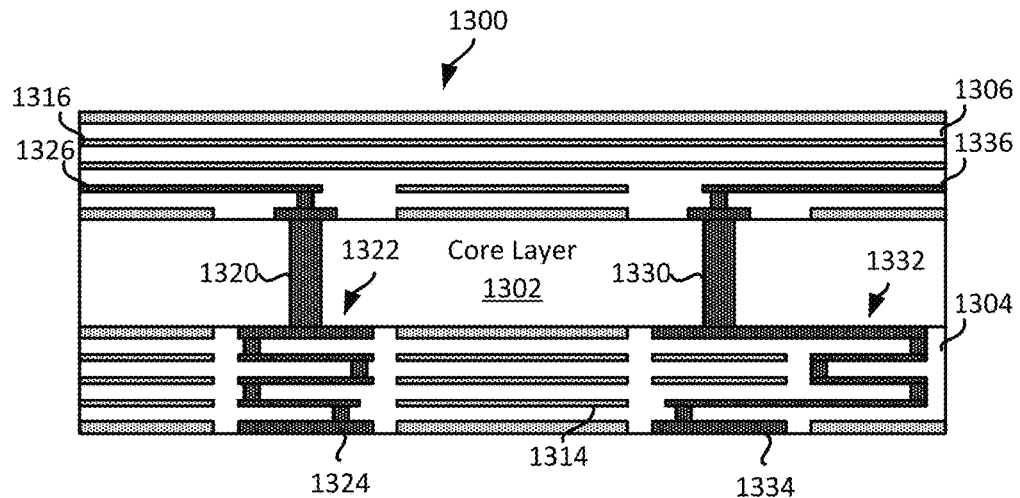
FIG. 13 illustrates an example of a package substrate that includes inductors.

Different implementations may provide inductors with different shapes and/or positions in a package substrate. FIG. 13 conceptually illustrates an example of a package substrate that includes an inductor that is offset from a via (e.g., pin). Specifically, FIG. 13 illustrates a package substrate 1300 that includes a core layer 1302, a first dielectric layer 1304, and a second dielectric layer 1306. In some implementations, the first dielectric layer 1304 may include several dielectric layers. Similarly, in some implementations, the second dielectric layer 1306 may include several dielectric layers.

The core layer 1302 includes a first via 1320 and a second via 1330. In some implementations, the first via 1320 and/or the second via 1330 may be a pin. The first dielectric layer 1304 includes a first set of interconnects 1314, a first inductor 1322, a first pad 1324, a second inductor 1332, and a second pad 1334. The second dielectric layer 1306 includes a second set of interconnects 1316, a third set of interconnects 1326, and a fourth set of interconnects 1336. As shown in FIG. 13, the second inductor 1332 is offset (e.g., vertically offset) from the second via 1330.

The first inductor 1322 includes several interconnects (e.g., traces, vias, pads), which are configured to provide a set of windings for the first inductor 1322. A first portion (e.g., top portion) of the first inductor 1322 is coupled to a first portion (e.g., bottom portion) of the first via 1320. A second portion (e.g., bottom portion) of the first inductor 1322 is coupled to the first pad 1324. In some implementations, the first pad 1324 is configured to couple to a set of solder balls. In some implementations, the first inductor 1322 is configured in such a way that the impedance of the first pad 1324 matches or closely matches the impedance of the signal interconnect to which the first pad 1324 will be coupled to. In some implementations, a signal interconnect may include one of at least a via (e.g., first via 1320) in the core layer 1302 and/or a set of interconnects (e.g., fourth set of interconnects 1336) in the second dielectric layer 1306. In some implementations, the signal interconnect may include the inductor 1322 and/or the inductor 1332. In some implementations, an interconnect may include a trace.

In some implementations, matching the impedance or reducing the difference between the impedance of a signal interconnect and the pad(s) provides better signal performance. For example, matching the impedance or reducing the impedance difference reduces signal loss and/or signal degradation between the pad and signal interconnect, thereby providing better signal performance for the package substrate.

A second portion (e.g., top portion) of the first via 1320 is coupled to the third set of interconnects 1326. The third set of interconnects 1326 are located in the second dielectric layer 1306. The third set of interconnects 1326 may include traces and/or vias.

The second inductor 1332 includes several interconnects (e.g., traces, vias, pads), which are configured to provide a set of windings for the second inductor 1332. A first portion (e.g., top portion) of the second inductor 1332 is coupled to a first portion (e.g., bottom portion) of the second via 1330. A second portion (e.g., bottom portion) of the second inductor 1332 is coupled to the second pad 1334. In some implementations, the second pad 1324 is configured to couple to a set of solder balls. In some implementations, the second inductor 1332 is configured in such a way that the impedance of the second pad 1334 matches or closely matches the impedance of the signal interconnect to which the second pad 1334 will be coupled to.

A second portion (e.g., top portion) of the second via 1330 is coupled to the fourth set of interconnects 1336. The fourth set of interconnects 1336 are located in the second dielectric layer 1306. The fourth set of interconnects 1336 may includes traces and/or vias.

Figure 14:
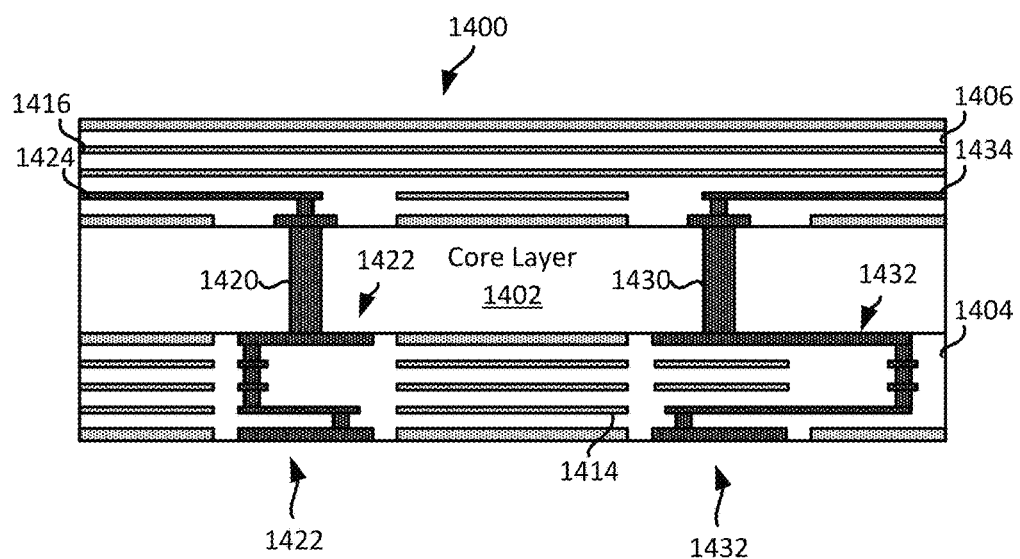
FIG. 14 illustrates an example of a package substrate that includes inductors.

FIG. 14 conceptually illustrates an example of a package substrate that includes an inductor that can produce a lateral magnetic field, where the inductor is offset form a via (e.g., pin). Specifically, FIG. 14 illustrates a package substrate 1400 that includes a core layer 1402, a first dielectric layer 1404, and a second dielectric layer 1406. In some implementations, the first dielectric layer 1404 may include several dielectric layers. Similarly, in some implementations, the second dielectric layer 1406 may include several dielectric layers.

The core layer 1402 includes a first via 1420 and a second via 1430. In some implementations, the first via 1420 and/or the second via 1430 may be a pin. The first dielectric layer 1404 includes a first set of interconnects 1414, a first inductor 1422, a first pad 1424, a second inductor 1432, and a second pad 1434. The second dielectric layer 1406 includes a second set of interconnects 1416, a third set of interconnects 1426, and a fourth set of interconnects 1436. As shown in FIG. 14, the second inductor 1432 is offset (e.g., vertically offset) from the second via 1430.

The first inductor 1422 includes several interconnects (e.g., traces, vias, pads), which are configured to provide a set of windings for the first inductor 1422. A first portion (e.g., top portion) of the first inductor 1422 is coupled to a first portion (e.g., bottom portion) of the first via 1420. A second portion (e.g., bottom portion) of the first inductor 1422 is coupled to the first pad 1424. In some implementations, the first pad 1424 is configured to couple to a set of solder balls. In some implementations, the first inductor 1422 is configured in such a way that the impedance of the first pad 1424 matches or closely matches the impedance of the signal interconnect to which the first pad 1424 will be coupled to. In some implementations, a signal interconnect may include one of at least a via (e.g., first via 1420) in the core layer 1402 and/or a set of interconnects (e.g., fourth set of interconnects 1436) in the second dielectric layer 1406. In some implementations, the signal interconnect may include the inductor 1422 and/or the inductor 1432. In some implementations, an interconnect may include a trace. The first inductor 1422 may be configured to provide a magnetic field that laterally traverses the package substrate 1400.

In some implementations, matching the impedance or reducing the difference between the impedance of the signal interconnect and the pads provides better signal performance. For example, matching the impedance or reducing the impedance difference reduces signal loss and/or signal degradation between the pad and the signal interconnect, thereby providing better signal performance for the package substrate.

A second portion (e.g., top portion) of the first via 1420 is coupled to the third set of interconnects 1426. The third set of interconnects 1426 are located in the second dielectric layer 1406. The third set of interconnects 1426 may includes traces and/or vias.

The second inductor 1432 includes several interconnects (e.g., traces, vias, pads), which are configured to provide a set of windings for the second inductor 1432. A first portion (e.g., top portion) of the second inductor 1432 is coupled to a first portion (e.g., bottom portion) of the second via 1430. A second portion (e.g., bottom portion) of the second inductor 1432 is coupled to the second pad 1434. In some implementations, the second pad 1424 is configured to couple to a set of solder balls.

In some implementations, the second inductor 1432 is configured in such a way that the impedance of the second pad 1434 matches or closely matches the impedance of the signal interconnect to which the second pad 1434 will be coupled to. The second inductor 1432 may be configured to provide a magnetic field that laterally traverses the package substrate 1400.

A second portion (e.g., top portion) of the second via 1430 is coupled to the fourth set of interconnects 1436. The fourth set of interconnects 1436 are located in the second dielectric layer 1406. The fourth set of interconnects 1436 may includes traces and/or vias.

Exemplary Electronic Devices

Figure 15:
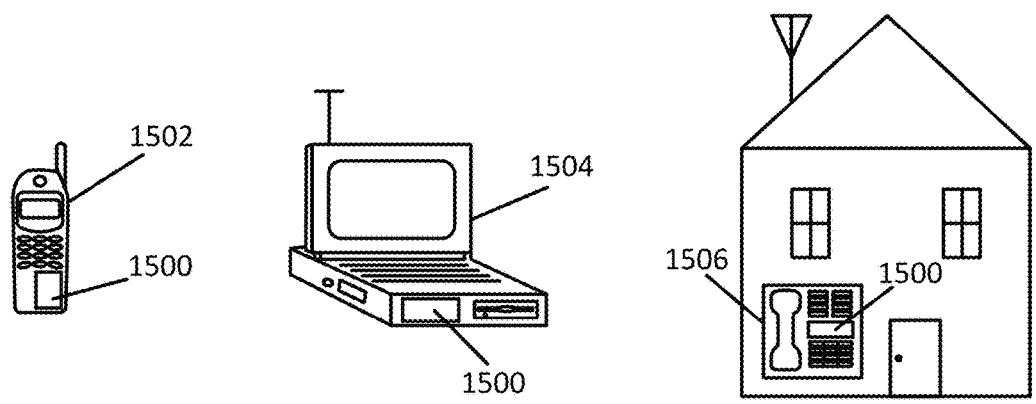
FIG. 15 illustrates various electronic devices that may integrate a semiconductor device, a die, a package substrate, an integrated circuit and/or PCB described herein.

FIG. 15 illustrates various electronic devices that may be integrated with any of the aforementioned semiconductor device, package substrate, integrated circuit, die, interposer or package. For example, a mobile telephone 1502, a laptop computer 1504, and a fixed location terminal 1506 may include an integrated circuit (IC) 1500 as described herein. The IC 1500 may be, for example, any of the integrated circuits, dice or packages described herein. The devices 1502, 1504, 1506 illustrated in FIG. 15 are merely exemplary. Other electronic devices may also feature the IC 1500 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11A-11D, 12, 13, 14 and/or 15 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11A-11D, 12, 13, 14 and/or 15 and its corresponding description in the present disclosure is not limited to dies and/or ICs. In some implementations, 2, 3, 4, 5, 6, 7, 8, 9, 10, 11A-11D, 12, 13, 14 and/or 15 and its corresponding description may be used to manufacture, create, provide, and/or produce integrated devices. In some an integrated device may include a die package, package substrate, an integrated circuit (IC), a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package substrate comprising:
   a core layer comprising a first surface and a second surface;
   a first via located in the core layer;
   a first dielectric layer coupled to the first surface of the core layer;
   a first inductor coupled to the first via in the core layer and configured to generate a first magnetic field, wherein the first inductor includes a first inductor segment coupled to a second inductor segment to form a first set of windings, wherein the first inductor segment is located in the first dielectric layer and the second inductor segment is located in a second dielectric layer, and wherein at least one of the first inductor segment and the second inductor segment include a first C configuration;
   a second via located in the core layer; and
   a second inductor coupled to the second via in the core layer and configured to generate a second magnetic field, wherein the second inductor includes a third inductor segment coupled to a fourth inductor segment to form a second set of windings, wherein the third inductor segment is located in the first dielectric layer and the fourth inductor segment is located in the second dielectric layer, and wherein at least one of the third inductor segment and the fourth inductor segment include a second C configuration.

2. The package substrate of claim 1, further comprising a first pad coupled to the first inductor, wherein the first pad is configured to couple to a solder ball.

3. The package substrate of claim 2, wherein the first inductor is configured to provide an impedance difference between the first pad and a signal interconnect of 2.5 ohms or less.

4. The package substrate of claim 1, wherein the first inductor comprises:
a first set of vias; and
a first set of interconnects.

5. The package substrate of claim 1, wherein the first inductor is positioned in at least the first dielectric layer and the second dielectric layer such that the first magnetic field that is generated by the first inductor affects the impedance of a second pad coupled to the second inductor.

6. The package substrate of claim 1,
wherein the first inductor and the second inductor are positioned adjacent to each other and the first and second C configurations are aligned such that the first magnetic field that is generated by the first inductor amplifies the second magnetic field that is generated by the second inductor.

7. The package substrate of claim 1, further comprising:
a third dielectric layer coupled to the second surface of the core layer; and
a set of interconnects in the third dielectric layer, the set of interconnects coupled to the first via located in the core layer.

8. The package substrate of claim 1, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and a laptop computer.

9. The package substrate of claim 1, wherein the first inductor is oriented to generate the first magnetic field according to an orientation of the second inductor.

10. An apparatus comprising:
a core layer comprising a first surface and a second surface;
a first via located in the core layer;
a first dielectric layer coupled to the first surface of the core layer;
a first inductor means coupled to the first via in the core layer and configured to generate a first magnetic field, wherein the first inductor means includes a first inductor segment coupled to a second inductor segment to form a first set of windings, wherein the first inductor segment is located in the first dielectric layer and the second inductor segment is located in a second dielectric layer, and wherein at least one of the first inductor segment and the second inductor segment include a first C configuration;
a second via located in the core layer; and
a second inductor means coupled to the second via in the core layer and configured to generate a second magnetic field, wherein the second inductor means includes a third inductor segment coupled to a fourth inductor segment to form a second set of windings, wherein the third inductor segment is located in the first dielectric layer and the fourth inductor segment is located in the second dielectric layer, and wherein at least one of the third inductor segment and the fourth inductor segment includes a second C configuration.

11. The apparatus of claim 10, further comprising a first pad coupled to the first inductor means, wherein the first pad is configured to couple to a solder ball.

12. The apparatus of claim 11, wherein the first inductor means is configured to provide an impedance difference between the first pad and a signal interconnect of 2.5 ohms or less.

13. The apparatus of claim 10, wherein the first inductor means comprises:
a first set of vias; and
a first set of interconnects.

14. The apparatus of claim 10, wherein the first inductor means is positioned in at least the first dielectric layer and the second dielectric layer such that the first magnetic field that is generated by the first inductor means affects the impedance of a second pad coupled to the second inductor means.

15. The apparatus of claim 10,
wherein the first inductor means and the second inductor means are positioned adjacent to each other and the first and second C configurations are aligned such that the first magnetic field that is generated by the first inductor means amplifies the second magnetic field that is generated by the second inductor means.

16. The apparatus of claim 10, further comprising:
a third dielectric layer coupled to the second surface of the core layer; and
a set of interconnects in the third dielectric layer, the set of interconnects coupled to the first via located in the core layer.

17. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and a laptop computer.

18. The apparatus of claim 10, wherein the first inductor means is oriented to generate the first magnetic field according to an orientation of the second inductor means.

19. A method for fabricating a package substrate, comprising:
forming a core layer comprising a first surface and a second surface;
forming a first via in the core layer;
forming a first dielectric layer coupled to the first surface of the core layer;
forming a first inductor coupled to the first via in the core layer and configured to generate a first magnetic field, wherein the first inductor includes a first inductor segment coupled to a second inductor segment to form a first set of windings, wherein the first inductor segment is located in the first dielectric layer and the second inductor segment is located in a second dielectric layer, and wherein at least one of the first inductor segment and the second inductor segment include a first C configuration;
forming a second via in the core layer; and
forming a second inductor coupled to the second via in the core layer and configured to generate a second magnetic field, wherein the second inductor includes a third inductor segment coupled to a fourth inductor segment to form a second set of windings, wherein the third inductor segment is located in the first dielectric layer and the fourth inductor segment is located in the second dielectric layer, and wherein at least one of the third inductor segment and the fourth inductor segment include a second C configuration.

20. The method of claim 19, further comprising forming a first pad such that the first pad is coupled to the first inductor, wherein the first pad is configured to couple to a solder ball.

21. The method of claim 20, wherein the first inductor is configured to provide an impedance difference between the first pad and a signal interconnect of 2.5 ohms or less.

22. The method of claim 19, wherein forming the first inductor comprises:
forming a first set of vias; and
forming a first set of interconnects.

23. The method of claim 19, wherein the first inductor is positioned in at least the first dielectric layer and the second dielectric layer such that the first magnetic field that is generated by the first inductor affects the impedance of a second pad coupled to the second inductor.

24. The method of claim 19,
wherein the first inductor and the second inductor are positioned adjacent to each other and the with their respective first and second C configurations are aligned such that the first magnetic field that is generated by the first inductor amplifies the second magnetic field that is generated by the second inductor.

25. The method of claim 19, further comprising:
forming a third dielectric layer coupled to the second surface of the core layer; and
forming a set of interconnects in the third dielectric layer, the set of interconnects coupled to the first via located in the core layer.

26. The method of claim 19, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and a laptop computer.

27. The method of claim 19, wherein the first inductor is oriented to generate the first magnetic field according to an orientation of the second inductor.

* * * * *